US011023284B2

(12) United States Patent
Crabtree et al.

(10) Patent No.: US 11,023,284 B2
(45) Date of Patent: Jun. 1, 2021

(54) SYSTEM AND METHOD FOR OPTIMIZATION AND LOAD BALANCING OF COMPUTER CLUSTERS

(71) Applicant: QOMPLX, Inc., Tysons, VA (US)

(72) Inventors: Jason Crabtree, Vienna, VA (US); Andrew Sellers, Colorado Springs, CO (US)

(73) Assignee: QOMPLX, INC., Tysons, VA (US)

( * ) Notice: Subject to any disclaimer, the term of this patent is extended or adjusted under 35 U.S.C. 154(b) by 328 days.

(21) Appl. No.: 15/849,901

(22) Filed: Dec. 21, 2017

(65) Prior Publication Data

US 2018/0232261 A1 Aug. 16, 2018

Related U.S. Application Data

(63) Continuation-in-part of application No. 15/835,312, filed on Dec. 7, 2017, which is a continuation-in-part
(Continued)

(51) Int. Cl.
*G06F 15/173* (2006.01)
*G06F 9/50* (2006.01)
(Continued)

(52) U.S. Cl.
CPC ............ *G06F 9/5083* (2013.01); *G06F 9/448* (2018.02); *G06F 9/505* (2013.01); *G06F 11/3457* (2013.01); *G06F 16/2453* (2019.01); *G06F 30/20* (2020.01); *G06Q 10/0637* (2013.01); *H04L 67/1008* (2013.01); *H04L 67/12* (2013.01); *H04L 67/42* (2013.01); *H04L 67/1002* (2013.01)

(58) Field of Classification Search
CPC .... G06F 9/5083; G06F 9/448; G06F 16/2453; G06F 9/505; G06F 11/3457; G06F 17/5009; G06F 2209/5019; G06F 11/3058; G06F 11/3452; G06F 11/3442; G06F 11/3006; H04L 67/1008; H04L 67/12; H04L 67/42; H04L 67/1002; G06Q 10/0637
USPC .......................... 709/226, 223, 203; 455/415
See application file for complete search history.

(56) References Cited

U.S. PATENT DOCUMENTS 5,669,000 A 9/1997 Jessen et al.
6,256,544 B1 7/2001 Weissinger
(Continued)

FOREIGN PATENT DOCUMENTS

| CN | 105302532 B | 6/2018 |
| WO | 2014159150 A1 | 10/2014 |
| WO | 2017075543 A1 | 5/2017 |

*Primary Examiner* — Thuong Nguyen
(74) *Attorney, Agent, or Firm* — Brian R. Galvin; Galvin Patent Law LLC

(57) ABSTRACT

A system and methods for optimization and load balancing for computer clusters, comprising a distributed computational graph, a server architecture using multi-dimensional time-series databases for continuous load simulation and forecasting, a server architecture using traditional databases for discrete load simulation and forecasting, and using a combination of real-time data and records of previous activity for continuous and precise load forecasting for computer clusters, datacenters, or servers.

4 Claims, 10 Drawing Sheets

Related U.S. Application Data of application No. 15/186,453, filed on Jun. 18, 2016, which is a continuation-in-part of application No. 15/166,158, filed on May 26, 2016, which is a continuation-in-part of application No. 15/141,752, filed on Apr. 28, 2016, which is a continuation-in-part of application No. 15/091,563, filed on Apr. 5, 2016, now Pat. No. 10,204,147, and a continuation-in-part of application No. 14/986,536, filed on Dec. 31, 2015, now Pat. No. 10,210,255, and a continuation-in-part of application No. 14/925,974, filed on Oct. 28, 2015, application No. 15/849,901, which is a continuation-in-part of application No. 15/835,436, filed on Dec. 7, 2017, now Pat. No. 10,572,828, which is a continuation-in-part of application No. 15/790,457, filed on Oct. 23, 2017, which is a continuation-in-part of application No. 15/790,327, filed on Oct. 23, 2017, which is a continuation-in-part of application No. 15/616,427, filed on Jun. 7, 2017, and a continuation-in-part of application No. 15/141,752, filed on Apr. 28, 2016.

(60) Provisional application No. 62/568,298, filed on Oct. 4, 2017, provisional application No. 62/568,291, filed on Oct. 4, 2017.

(51) Int. Cl.
| | | |
|---|---|---|
| *G06F 11/34* | (2006.01) | |
| *G06F 16/2453* | (2019.01) | |
| *H04L 29/06* | (2006.01) | |
| *H04L 29/08* | (2006.01) | |
| *G06F 9/448* | (2018.01) | |
| *G06F 30/20* | (2020.01) | |
| *G06Q 10/06* | (2012.01) | |

(56) References Cited

U.S. PATENT DOCUMENTS

| | | | |
|---|---|---|---|
| 8,135,820 B2* | 3/2012 | Richardson | H04L 61/1511 709/223 |
| 9,483,049 B2* | 11/2016 | Maeda | G06K 9/00536 |
| 2005/0108294 A1* | 5/2005 | Koerner | G06F 16/283 |
| 2009/0222562 A1 | 9/2009 | Liu et al. | |
| 2011/0319061 A1* | 12/2011 | Schmackpfeffer | H04L 51/24 455/415 |
| 2012/0266244 A1 | 10/2012 | Green et al. | |
| 2013/0018895 A1* | 1/2013 | Harless | G10L 15/1822 707/748 |
| 2013/0212154 A1* | 8/2013 | Lehto | H04L 67/42 709/203 |
| 2014/0156806 A1 | 6/2014 | Karpistsenko et al. | |
| 2014/0279762 A1 | 9/2014 | Xaypanya et al. | |
| 2015/0149979 A1 | 5/2015 | Talby et al. | |
| 2015/0169294 A1 | 6/2015 | Brock et al. | |
| 2015/0379424 A1 | 12/2015 | Dirac et al. | |
| 2016/0078361 A1 | 3/2016 | Brueckner et al. | |
| 2016/0246849 A1* | 8/2016 | Frampton | G06F 16/2455 |
| 2016/0275123 A1 | 9/2016 | Lin et al. | |
| 2016/0364307 A1 | 12/2016 | Garg et al. | |
| 2017/0109678 A1* | 4/2017 | Chu | G06Q 10/06393 |
| 2017/0193110 A1 | 7/2017 | Crabtree et al. | |
| 2017/0322959 A1* | 11/2017 | Tidwell | G06F 16/2228 |
| 2017/0323089 A1 | 11/2017 | Duggal et al. | |
| 2018/0150565 A1* | 5/2018 | Asgekar | G06F 16/29 |
| 2018/0232261 A1* | 8/2018 | Crabtree | G06F 9/448 |
| 2018/0300930 A1* | 10/2018 | Kennedy | A63F 13/355 |
| 2019/0082305 A1* | 3/2019 | Proctor | H04W 4/10 |

* cited by examiner

SYSTEM AND METHOD FOR OPTIMIZATION AND LOAD BALANCING OF COMPUTER CLUSTERS

CROSS-REFERENCE TO RELATED APPLICATIONS

This application is a continuation-in-part of U.S. patent application Ser. No. 15/835,312, titled, "A SYSTEM AND METHODS FOR MULTI-LANGUAGE ABSTRACT MODEL CREATION FOR DIGITAL ENVIRONMENT SIMULATIONS" and filed on Dec. 7, 2017, which is a continuation-in-part of U.S. patent application Ser. No. 15/186,453, titled, "SYSTEM FOR AUTOMATED CAPTURE AND ANALYSIS OF BUSINESS INFORMATION FOR RELIABLE BUSINESS VENTURE OUTCOME PREDICTION" and filed on Jun. 18, 2016, which is a continuation-in-part of U.S. patent application Ser. No. 15/166,158, titled "SYSTEM FOR AUTOMATED CAPTURE AND ANALYSIS OF BUSINESS INFORMATION FOR SECURITY AND CLIENT-FACING INFRASTRUCTURE RELIABILITY", and filed on May 26, 2016, which is a continuation-in-part of U.S. patent application Ser. No. 15/141,752, titled "SYSTEM FOR FULLY INTEGRATED CAPTURE, AND ANALYSIS OF BUSINESS INFORMATION RESULTING IN PREDICTIVE DECISION MAKING AND SIMULATION, and filed on Apr. 28, 2016, which is a continuation-in-part of U.S. patent application Ser. No. 14/925,974, titled "RAPID PREDICTIVE ANALYSIS OF VERY LARGE DATA SETS USING THE DISTRIBUTED COMPUTATIONAL GRAPH" and filed on Oct. 28, 2015, and is also a continuation-in-part of U.S. patent application Ser. No. 14/986,536, titled "DISTRIBUTED SYSTEM FOR LARGE VOLUME DEEP WEB DATA EXTRACTION", and filed on Dec. 31, 2015, and is also a continuation-in-part of U.S. patent application Ser. No. 15/091,563, titled "SYSTEM FOR CAPTURE, ANALYSIS AND STORAGE OF TIME SERIES DATA FROM SENSORS WITH HETEROGENEOUS REPORT INTERVAL PROFILES", and filed on Apr. 5, 2016, the entire specification of each of which is incorporated herein by reference in its entirety.

This application is also a continuation-in-part of U.S. patent application Ser. No. 15/835,436, titled, "TRANSFER LEARNING AND DOMAIN ADAPTATION USING DISTRIBUTABLE DATA MODELS" and filed on Dec. 7, 2017, which is a continuation-in-part of U.S. patent application Ser. No. 15/790,457, titled "IMPROVING A DISTRIBUTABLE MODEL WITH BIASES CONTAINED WITHIN DISTRIBUTED DATA", filed on Oct. 23, 2017, which claims priority to U.S. provisional patent application Ser. No. 62/568,298, titled "DISTRIBUTABLE MODEL WITH BIASES CONTAINED WITHIN DISTRIBUTED DATA", filed on Oct. 4, 2017, and is also a continuation-in-part of U.S. patent application Ser. No. 15/790,327, titled "MULTITEMPORAL DATA ANALYSIS", filed on Oct. 23, 2017, which claims priority to U.S. provisional patent application Ser. No. 62/568,291, titled "IMPROVING A DISTRIBUTABLE MODEL WITH DISTRIBUTED DATA", filed on Oct. 4, 2017, and is also a continuation-in-part of U.S. patent application Ser. No. 15/616,427 titled "RAPID PREDICTIVE ANALYSIS OF VERY LARGE DATA SETS USING AN ACTOR DRIVEN DISTRIBUTED COMPUTATIONAL GRAPH", filed on Jun. 7, 2017, and is also a continuation-in-part of U.S. patent application Ser. No. 15/141,752, titled "SYSTEM FOR FULLY INTEGRATED CAPTURE, AND ANALYSIS OF BUSINESS INFORMATION RESULTING IN PREDICTIVE DECISION MAKING AND SIMULATION", filed on Apr. 28, 2016, the entire specification of each of which is incorporated herein by reference in its entirety.

BACKGROUND OF THE INVENTION

Field of the Art

The disclosure relates to the field of distributed computing, more specifically the field of load balancing and optimization of distributed computer clusters.

Discussion of the State of the Art

It is currently the case that applying a distributed and managed sequence of functions to data throughout a cluster of computing devices is a very taxing and difficult problem faced by the computing industry. The problems in distributed computing are numerous, and have been tackled for many years now; important problems faced by distributed computing systems are the efficiency of operations which take place over many devices, the rate of data transfer between them, the coordination of data for operations taking place over multiple devices in the system, optimizing the allocation of resources to balance cost and processing completion, and more. Innovative solutions to these problems and incremental improvements on previous solutions are core to the development of datacenters for many purposes including the Internet, defense purposes, computing problems for NASA including the Search for Extra Terrestrial Intelligence (SETI) program, and more.

Many attempts have been made to manage clusters of computing devices for improved efficiency, such as the software KUBERNETES™ and the programming language ERLANG™, however there are limitations to current technology which include a limitation on forecasting server load in the case of remote servers and datacenters, and lack of flexibility in implementation. Many systems require specific, rigid operating systems or structures, paradigms, and input formats, which restricts their use cases. One major issue is a limitation in distributed systems to accurately forecast server load and appropriately configure operations in the system based on current data and events as well as previous data from similar periods of activity, for a holistic approach to handling varying server loads in distributed systems.

What is needed is a system and method for optimization and load balancing for computer clusters which can accept a more diverse input, be implemented on more systems, and more accurately forecast server load based on a continuous stream of information from devices in the system as well as relevant records on past activity in the system.

SUMMARY OF THE INVENTION

Accordingly, the inventor has conceived and reduced to practice, in a preferred embodiment of the invention, a system and methods for optimization and load balancing for computer clusters. The following non-limiting summary of the invention is provided for clarity, and should be construed consistently with embodiments described in the detailed description below.

To solve the problem of, a system and methods have been devised for optimization and load balancing for computer clusters, comprising a distributed computational graph, a server architecture using multi-dimensional time-series databases for continuous load simulation and forecasting, a server architecture using traditional databases for discrete load simulation and forecasting, and using a combination of real-time data and records of previous activity for continuous and precise load forecasting for computer clusters, datacenters, or servers.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION

Figure 1:
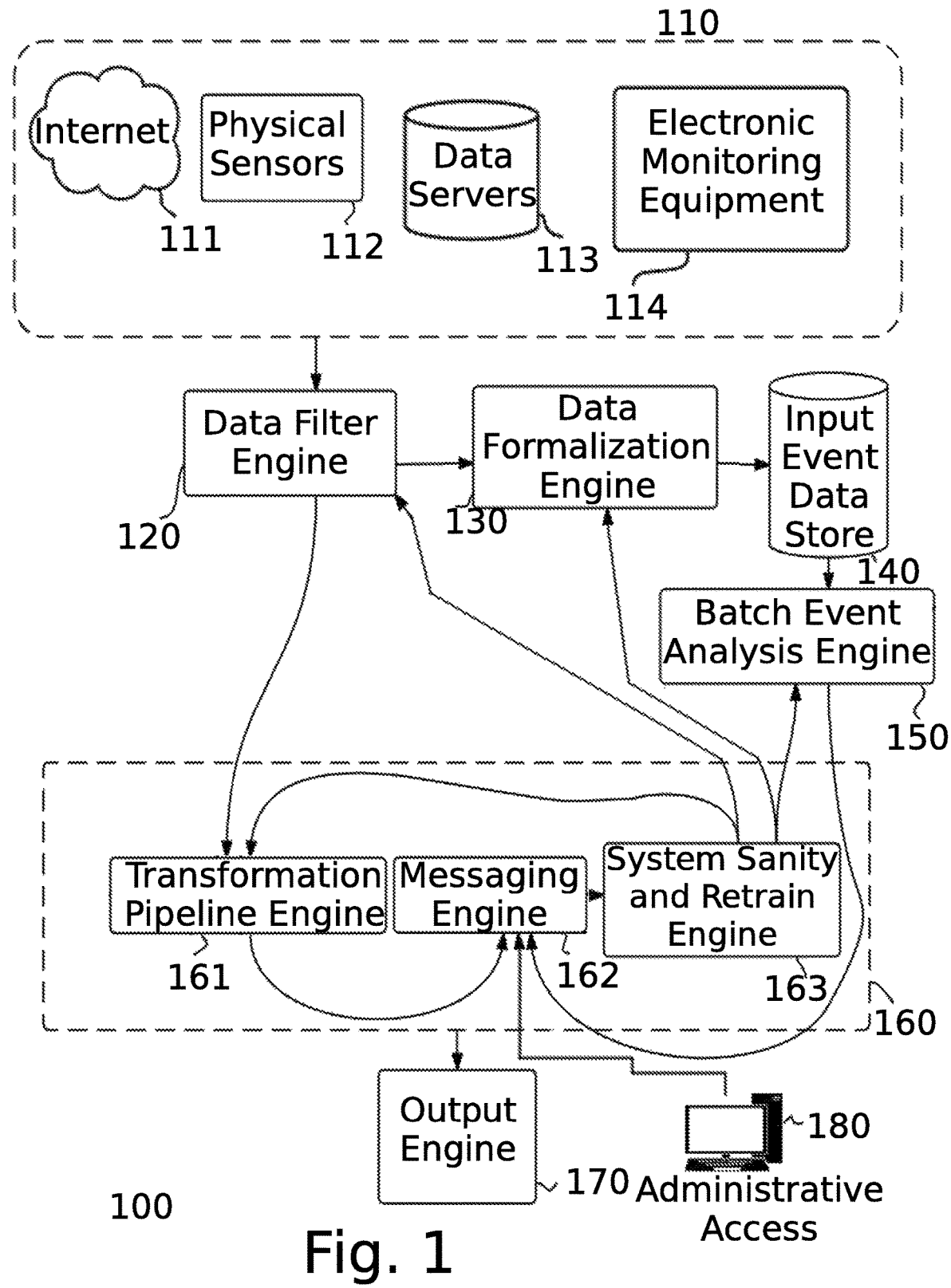
FIG. 1 is a block diagram illustrating an exemplary hardware architecture of a computing device used in various embodiments of the invention.

The inventor has conceived, and reduced to practice, a system and methods for optimization and load balancing of computer clusters.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

FIG. 1 is a block diagram of an exemplary architecture for a system 100 for predictive analysis of very large data sets using a distributed computational graph. According to the embodiment, streaming input feeds 110 may be a variety of data sources which may include but are not limited to the internet 111, arrays of physical sensors 112, database servers 113, electronic monitoring equipment 114 and direct human interaction ranging from a relatively few number of participants to a large crowd sourcing campaign. Streaming data from any combinations of listed sources and those not listed may also be expected to occur as part of the operation of the invention as the number of streaming input sources is not limited by the design. All incoming streaming data maybe passed through a data filter software engine 120 to remove information that has been damaged in transit, is misconfigured, or is malformed in some way that precludes use. Many of the filter parameters may be expected to be preset prior to operation, however, design of the invention makes provision for the behavior of the filter software engine 120 to be changed as progression of analysis requires through the automation of the system sanity and retrain software engine 163 which may serve to optimize system operation and analysis function. The data stream may also be split into two identical substreams at the data filter software engine 120 with one substream being fed into a streaming analysis pathway that includes the transformation pipeline software engine 161 of the distributed computational graph 160. The other substream may be fed to data formalization software engine 130 as part of the batch analysis pathway. The data formalization engine 130 formats the data stream entering the batch analysis pathway of the invention into data records to be stored by the input event data store 140. The input event data store 140 can be a database of any architectural type known to those knowledgeable in the art, but based upon the quantity of the data the data store engine would be expected to store and retrieve, options using highly distributed storage and map reduce query protocols, of which Hadoop is one, but not the only example, may be generally preferable to relational database schema.

Analysis of data from the input event data store may be performed by the batch event analysis software engine 150. This engine may be used to analyze the data in the input event data store for temporal information such as trends, previous occurrences of the progression of a set of events, with outcome, the occurrence of a single specific event with all events recorded before and after whether deemed relevant at the time or not, and presence of a particular event with all documented possible causative and remedial elements, including best guess probability information, including heuristics about task queue consumption rates and average job runtimes in the past. Those knowledgeable in the art will recognize that while examples here focus on having stores of information pertaining to time, the use of the invention is not limited to such contexts as there are other fields where having a store of existing data would be critical to predictive analysis of streaming data 161. The search parameters used by the batch event analysis software engine 150 are preset by those conducting the analysis at the beginning of the process, however, as the search matures and results are gleaned from the streaming data during transformation pipeline software engine 161 operation, providing the system more timely event progress details, the system sanity and retrain software engine 163 may automatically update the batch analysis parameters 150. Alternately, findings outside the system may precipitate the authors of the analysis to tune the batch analysis parameters administratively from outside the system 170, 162, 163. The real-time data analysis core 160 of the invention should be considered made up of a transformation pipeline software engine 161, messaging engine 162 and system sanity and retrain software engine 163. The messaging engine 162 has connections from both the batch and the streaming data analysis pathways and serves as a conduit for operational as well as result information between those two parts of the invention. The message engine also receives messages from those administering analyses 180. Messages aggregated by the messaging engine 162 may then be sent to system sanity and retrain software engine 163 as appropriate. Several of the functions of the system sanity and retrain software engine have already been disclosed. Briefly, this is software that may be used to monitor the progress of streaming data analysis optimizing coordination between streaming and batch analysis pathways by modifying or "retraining" the operation of the data filter software engine 120, data formalization software engine 130 and batch event analysis software engine 140 and the transformation pipeline engine 150 of the streaming pathway when the specifics of the search may change due to results produced during streaming analysis. System sanity and retrain engine 163 may also monitor for data searches or transformations that are processing slowly or may have hung and for results that are outside established data stability boundaries so that actions can be implemented to resolve the issue. While the system sanity and retrain software engine 163 may be designed to act autonomously and employs computer learning algorithms, according to some arrangements status updates may be made by administrators or potentially direct changes to operational parameters by such, according to the embodiment.

Streaming data entering from the outside data feeds 110 through the data filter software engine 120 may be analyzed in real time within the transformation pipeline software engine 161. Within a transformation pipeline, a set of functions tailored to the analysis being run are applied to the input data stream. According to the embodiment, functions may be applied in a linear, directed path or in more complex configurations. Functions may be modified over time during an analysis by the system sanity and retrain software engine 163 and the results of the transformation pipeline, impacted by the results of batch analysis are then output in the format stipulated by the authors of the analysis which may be human readable printout, an alarm, machine readable information destined for another system or any of a plurality of other forms known to those in the art.

Figure 2:
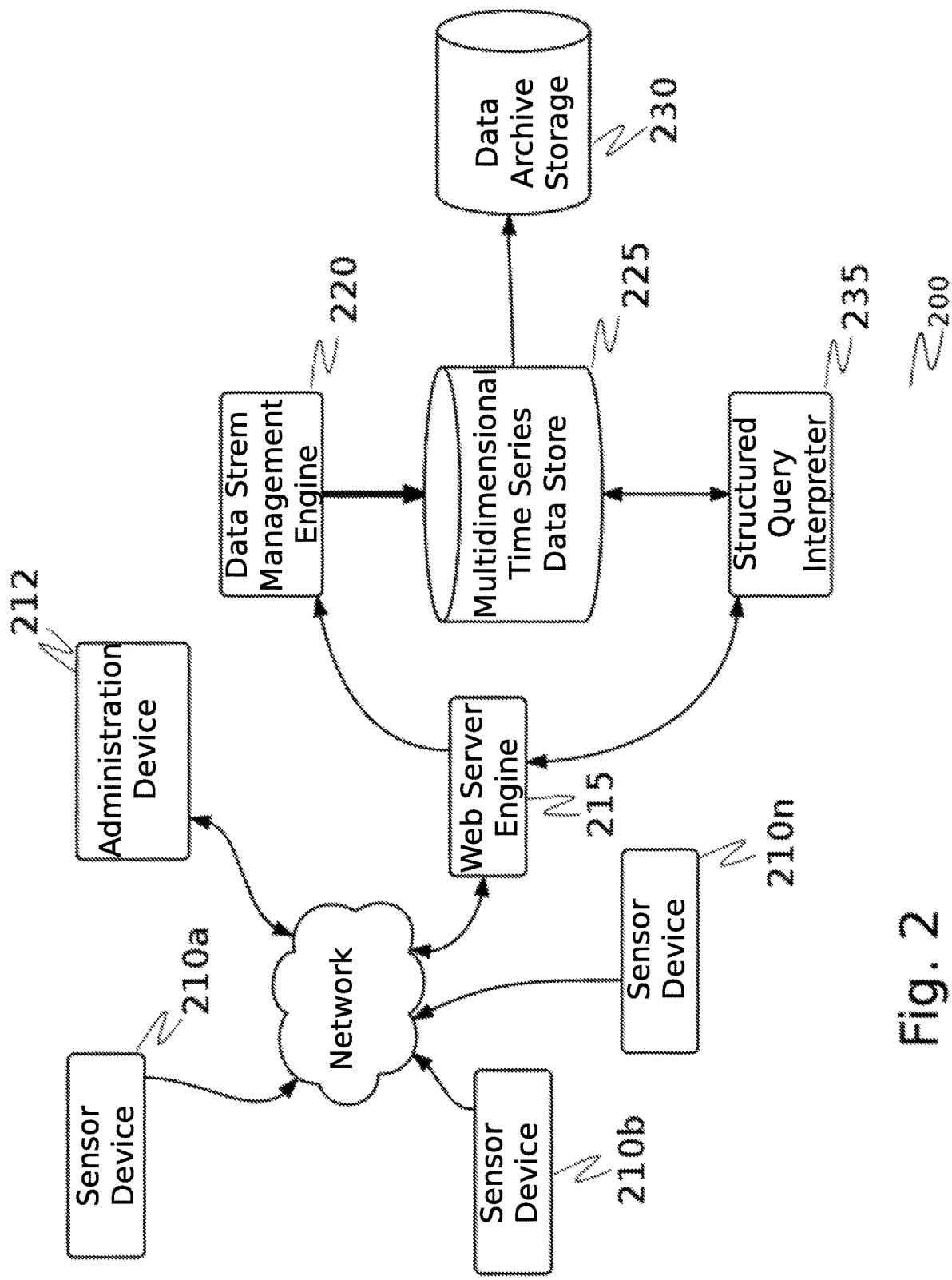
FIG. 2 is a diagram of an exemplary architecture of a system for the capture and storage of time series data from sensors with heterogeneous reporting profiles according to an embodiment of the invention.

FIG. 2 is a diagram of an exemplary architecture of a system for the capture and storage of time series data from sensors with heterogeneous reporting profiles according to an embodiment of the invention 200. In this embodiment, a plurality of sensor devices 210a-n stream data to a collection device, in this case a web server acting as a network gateway 215. These sensors 210a-n can be of several forms, some non-exhaustive examples being: physical sensors measuring humidity, pressure, temperature, orientation, and presence of a gas; or virtual such as programming measuring a level of network traffic, memory usage in a controller, and number of times the word "refill" is used in a stream of email messages on a particular network segment, to name a small few of the many diverse forms known to the art. In the embodiment, the sensor data is passed without transformation to the data management engine 220, where it is aggregated and organized for storage in a specific type of data store 225 designed to handle the multidimensional time series data resultant from sensor data. Raw sensor data can exhibit highly different delivery characteristics. Some sensor sets may deliver low to moderate volumes of data continuously. It would be infeasible to attempt to store the data in this continuous fashion to a data store as attempting to assign identifying keys and the to store real time data from multiple sensors would invariably lead to significant data loss. In this circumstance, the data stream management engine 220 would hold incoming data in memory, keeping only the parameters, or "dimensions" from within the larger sensor stream that are pre-decided by the administrator of the study as important and instructions to store them transmitted from the administration device 212. The data stream management engine 220 would then aggregate the data from multiple individual sensors and apportion that data at a predetermined interval, for example, every 10 seconds, using the timestamp as the key when storing the data to a multidimensional time series data store over a single swimlane of sufficient size. This highly ordered delivery of a foreseeable amount of data per unit time is particularly amenable to data capture and storage but patterns where delivery of data from sensors occurs irregularly and the amount of data is extremely heterogeneous are quite prevalent. In these situations, the data stream management engine cannot successfully use strictly single time interval over a single swimlane mode of data storage. In addition to the single time interval method the invention also can make use of event based storage triggers where a predetermined number of data receipt events, as set at the administration device 212, triggers transfer of a data block consisting of the apportioned number of events as one dimension and a number of sensor ids as the other. In the embodiment, the system time at commitment or a time stamp that is part of the sensor data received is used as the key for the data block value of the value-key pair. The invention can also accept a raw data stream with commitment occurring when the accumulated stream data reaches a predesigned size set at the administration device 212.

It is also likely that during times of heavy reporting from a moderate to large array of sensors, the instantaneous load of data to be committed will exceed what can be reliably transferred over a single swimlane. The embodiment of the invention can, if capture parameters pre-set at the administration device 212, combine the data movement capacity of two or more swimlanes, the combined bandwidth dubbed a metaswimlane, transparently to the committing process, to accommodate the influx of data in need of commitment. All sensor data, regardless of delivery circumstances are stored in a multidimensional time series data store 225 which is designed for very low overhead and rapid data storage and minimal maintenance needs to sap resources. The embodiment uses a key-value pair data store examples of which are Riak, Redis and Berkeley DB for their low overhead and speed, although the invention is not specifically tied to a single data store type to the exclusion of others known in the art should another data store with better response and feature characteristics emerge. Due to factors easily surmised by those knowledgeable in the art, data store commitment reliability is dependent on data store data size under the conditions intrinsic to time series sensor data analysis. The number of data records must be kept relatively low for the herein disclosed purpose. As an example one group of developers restrict the size of their multidimensional time series key-value pair data store to approximately $8.64 \times 10^4$ records, equivalent to 24 hours of 1 second interval sensor readings or 60 days of 1 minute interval readings. In this development system the oldest data is deleted from the data store and lost. This loss of data is acceptable under development conditions but in a production environment, the loss of the older data is almost always significant and unacceptable. The invention accounts for this need to retain older data by stipulating that aged data be placed in long term storage. In the embodiment, the archival storage is included 230. This archival storage might be locally provided by the user, might be cloud based such as that offered by Amazon Web Services or Google or could be any other available very large capacity storage method known to those skilled in the art.

Reliably capturing and storing sensor data as well as providing for longer term, offline, storage of the data, while important, is only an exercise without methods to repetitively retrieve and analyze most likely differing but specific sets of data over time. The invention provides for this requirement with a robust query language that both provides straightforward language to retrieve data sets bounded by multiple parameters, but to then invoke several transformations on that data set prior to output. In the embodiment isolation of desired data sets and transformations applied to that data occurs using pre-defined query commands issued from the administration device 212 and acted upon within the database by the structured query interpreter 235. Below is a highly simplified example statement to illustrate the method by which a very small number of options that are available using the structured query interpreter 235 might be accessed.

SELECT [STREAMING|EVENTS] data_spec FROM [unit] timestamp TO timestamp 15 GROUPBY (sensor_id, identifier) FILTER [filter_identifier] FORMAT [sensor [AS identifier] [, sensor [AS identifier]] . . . ] (TEXT|JSON-|FUNNEL|KML|GEOJSON|TOPOJSON);

Here "data_spec" might be replaced by a list of individual sensors from a larger array of sensors and each sensor in the list might be given a human readable identifier in the format "sensor AS identifier". "unit" allows the researcher to assign a periodicity for the sensor data such as second (s), minute (m), hour (h). One or more transformational filters, which include but a not limited to: mean, median, variance, standard deviation, standard linear interpolation, or Kalman filtering and smoothing, may be applied and then data formatted in one or more formats examples of with are text, JSON, KML, GEOJSON and TOPOJSON among others known to the art, depending on the intended use of the data.

Figure 3:
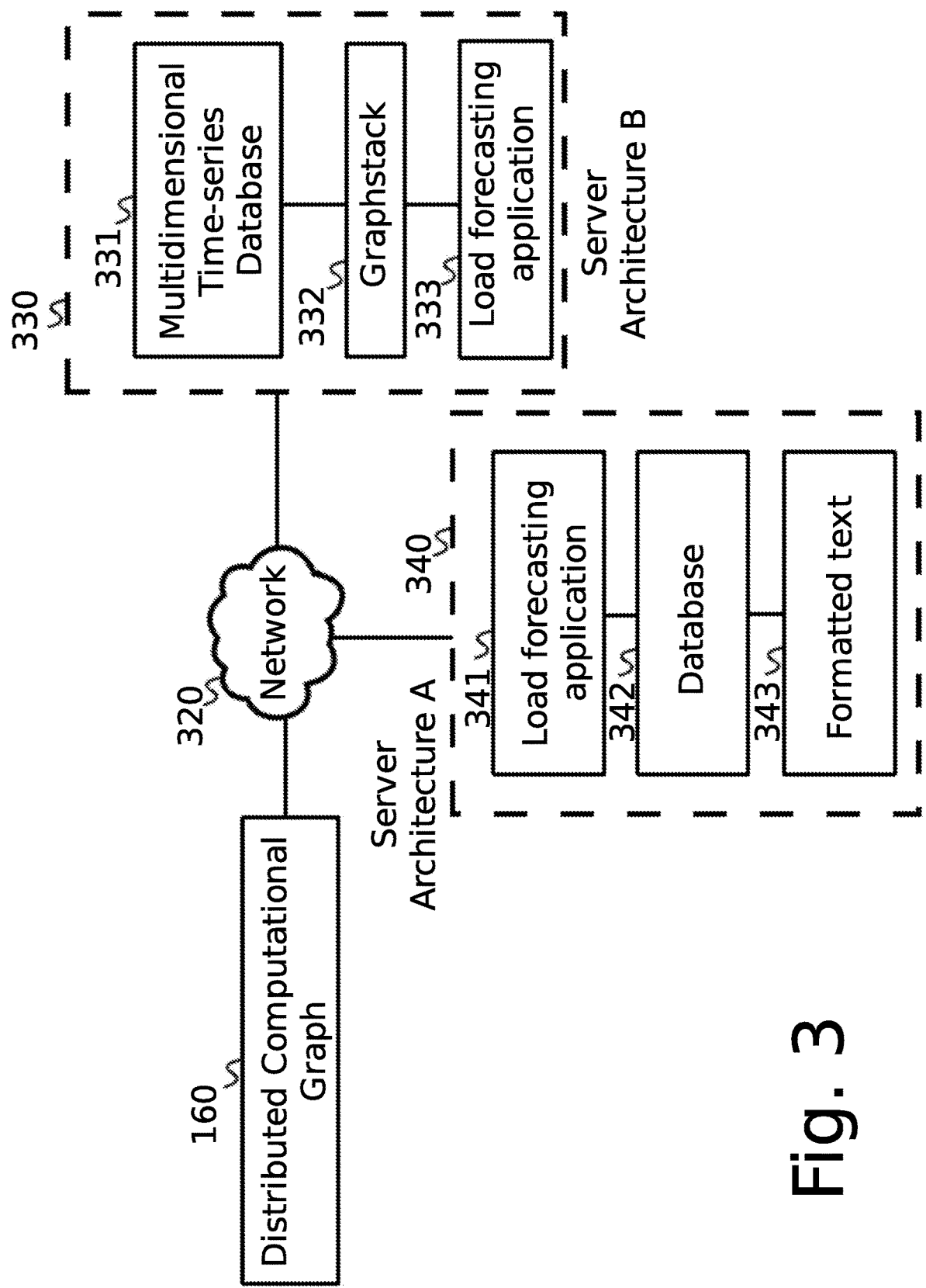
FIG. 3 is a diagram illustrating an exemplary hardware architecture of a distributed computational graph interacting with multiple arrangements of computer cluster components for optimization and load forecasting.

FIG. 3 is a diagram illustrating an exemplary hardware architecture of a distributed computational graph 160 interacting with multiple arrangements of computer cluster components for optimization and load forecasting. A distributed computational graph 160 is applied across a network 320 and connects to a server which can contain one of two possible architectures 330, 340. One such server architecture 330 operates a multidimensional time-series database (MDTSDB) 331, operating with a graphstack system 332, which serve to record events occurring both on the server 330 and happening with sensors and devices connected to the server, of which there may be zero or several, according to a preferred aspect. Events in a MDTSDB 331 operating in a graphstack environment 332 are recorded as they occur, in a sequence based on the time the events occurred, and relationships between data across timespans is used in a data pipeline for load forecasting 333. It is important to note that in this configuration the load forecasting application 333 relies on input from the graphstack system 332 working with the MDTSDB 331. In such a configuration 330, a data pipeline from a distributed computational graph 160 may operate dynamically on data from an MDTSDB 341, leading to dynamic and changing results from the data pipeline and resulting in highly accurate load forecasting 343. An alternative device architecture 340 illustrates a second use case for the system. In this configuration, a load forecasting application 341 may be run without a MDTSDB 331 or time series of data from server activities. In such a configuration 340 a database 342 may exist which stores a data pipeline used in the distributed computational graph 160 for data processing, as formatted text 343. Databases 342 which may be used include SQL databases and NoSQL databases including MONGODB™, where the formatted text 343 may be relational entries in the case of SQL and other relational databases 342, or JavaScript Object Notation (JSON) stored as a document in NoSQL databases 342.

Figure 4:
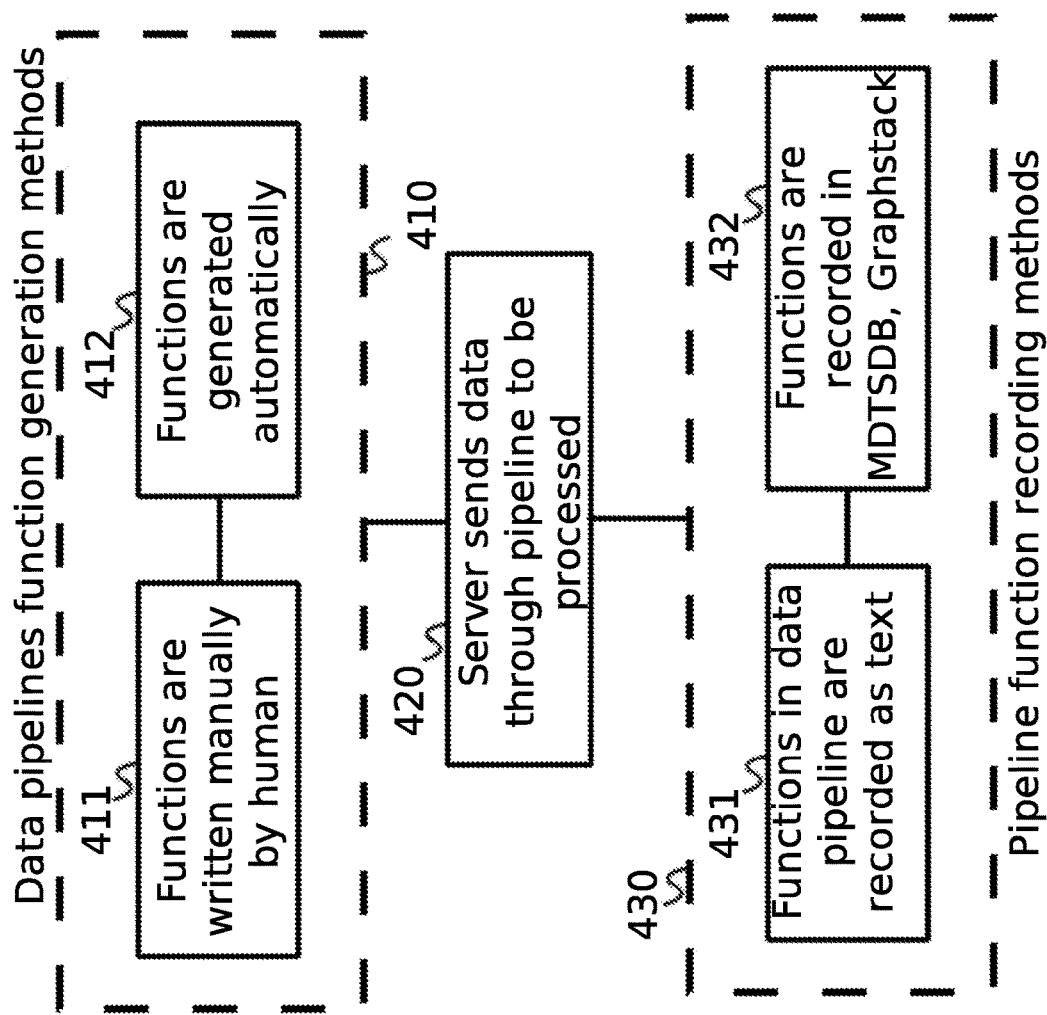
FIG. 4 is a method diagram illustrating the primary methods for creation of functions in a data pipeline and their storage on a server, according to a preferred aspect.

FIG. 4 is a method diagram illustrating the primary methods for creation of functions in a data pipeline and their storage on a server, according to a preferred aspect. Data pipelines 410 as used in the distributed computational graph 160 may be written either manually by a human 411, or may be produced partially or completely procedurally 412, with the use of time-series data gathered from an MDTSDB 331. In such a configuration 330 several functions in a data pipeline for a load forecasting service 333 may be dynamic and based on MDTSDB data, representing semi-continuous data flow over time from any devices connected to the server or computer cluster and processed in part by the distributed computational graph 160. In an alternate configuration 340, without the use of an MDTSDB 331, a load forecasting application 341 may load a discrete amount of data from records held in a database or datastore 342 with formatted text 343, which may hold functions for the data pipeline for load forecasting which are written manually by a human 411. Regardless of which server architecture is chosen, the server 330, 340 or servers in a computer cluster receive these functions 420, which may be in the form of plain text or formatted text 343, or data in a MDTSDB system 331. These functions are then recorded 430 on the server 330 either as a form of text 431, such as a JSON document in a database such as MONGODB™, or in the case of an architecture with an MDTSDB 330 the functionality of the data pipeline is recorded in an MDTSDB database utilizing a graphstack system 432.

Figure 5:
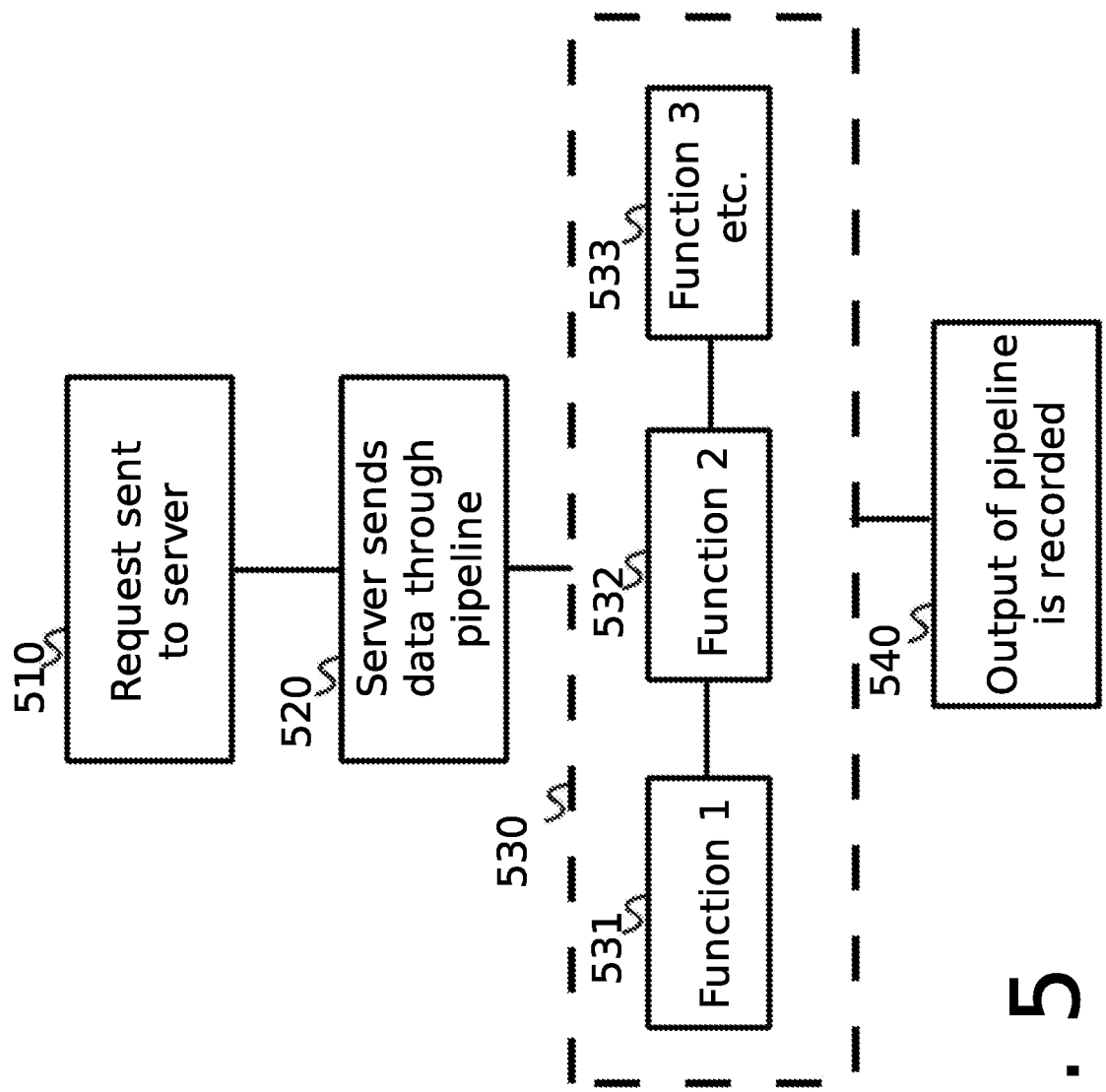
FIG. 5 is a method diagram illustrating a data pipeline acting on data and recording the result, according to a preferred aspect.

FIG. 5 is a method diagram illustrating a data pipeline acting on data and recording the result, according to a preferred aspect. A request from a user or service is sent 510 to a server using either basic configuration outlined in FIG. 3, 330, 340. This can be for either load forecasting, or for other purposes such as text analysis, image recognition, or other uses for data pipelines and distributed computational graphs 160 for computing clusters to optimize tasks across multiple devices. At least one server may send data through the pipeline 520, which means to refine data through a series of functions, subroutines, or other processes, the processes being defined by either automation 412 or manual input 411. Data proceeds through a pipeline 530 which may hold an undetermined amount of functions 531, 532, 533. For example, a server working in a datacenter run by GOOGLE™ could, using this system, use data pipelines run by distributed computational graphs 160 and MDTSDB server architectures 330 to more efficiently predict server load for image recognition in their search engine, and simultaneously use a different pipeline 530 which may be used in the image recognition search engine itself. Steps in this example could consist of, but need not be limited to, transforming an image inputted by the user to a specific resolution, recognizing color densities across regions of the image, and locating images in their databases or on the internet which have similar color density regions. In any use of the pipelines used with the distributed computational graph 160, the output of the pipeline is recorded 540, possibly only in RAM and to be deleted later after it is use for some other purpose, but the data may be recorded in a database as well, according to whichever server configuration is used 330, 340.

Figure 6:
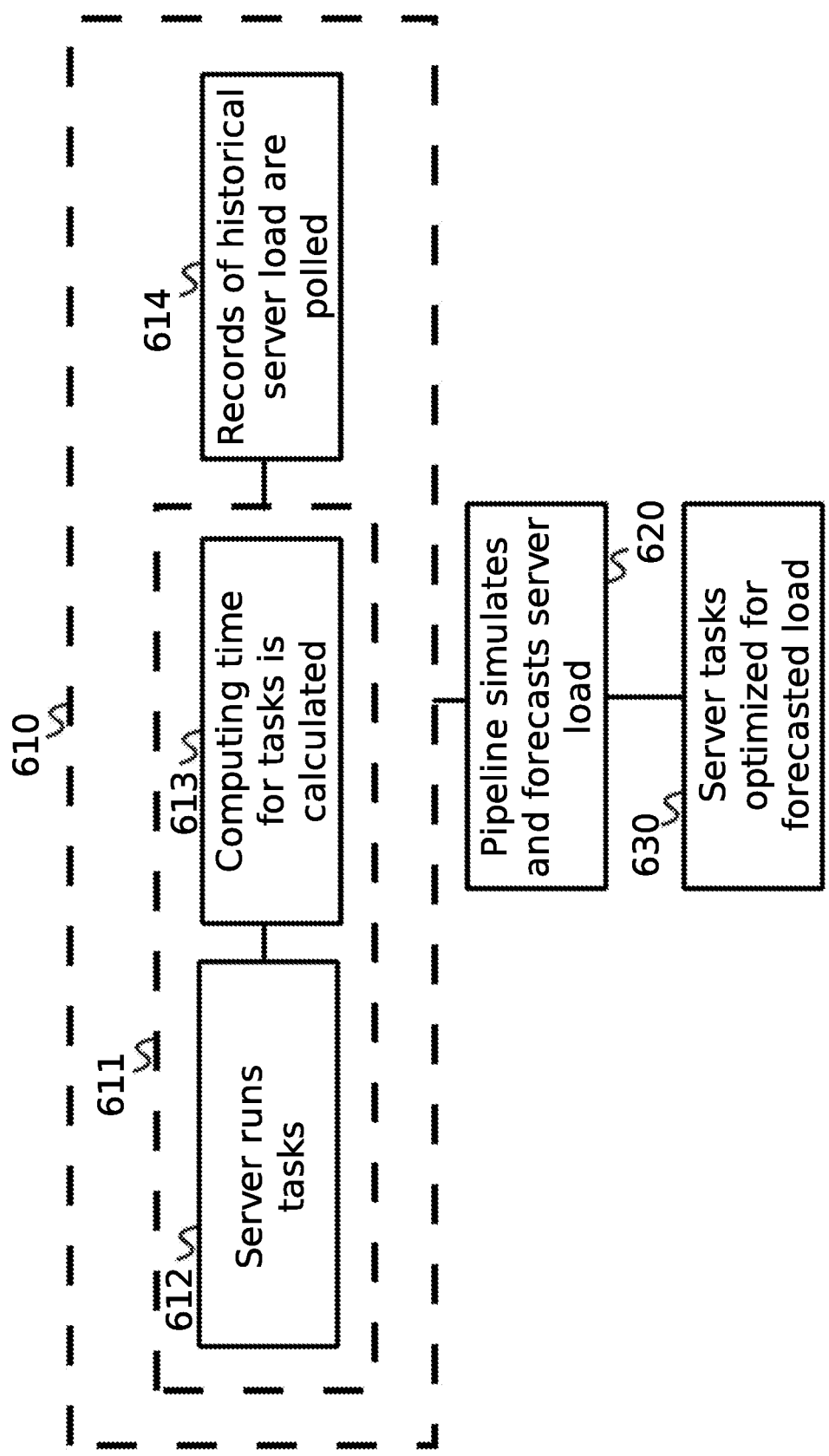
FIG. 6 is a method diagram illustrating the steps for forecasting server load using a data pipeline stored in a multidimensional time-series database, according to a preferred aspect.

FIG. 6 is a method diagram illustrating the steps for forecasting server load using a data pipeline stored in a multidimensional time-series database 331, according to a preferred aspect. A server's entirety of data 610 is used for load simulation and forecasting, which comprises data from current activities 611, as well as records 614 from previous active periods on the server or computing cluster. A device in such a cluster, or a lone server in some cases, may be running tasks 612, for which it is important to calculate the computing time required to accomplish these tasks 613. Such tasks may be web pages loading, web apps running, interaction with game players for online video games, and more. This is made possible especially easily in MDTSDB configurations 330, which provides continuous time-series data on activities of connected devices and services. Records of server or device activity are also accessed 614, which may be used in systems of any configuration 330, 340, for discrete load simulation and forecasting. The pipeline functions which may be written by a human manually 411, or determined partially or entirely automatically based on MDTSDB architectures 330, 412, will then act on this data to simulate the expected load 620 and then take appropriate measures to optimize the tasks running and which tasks to delegate to other connected machines, based on this load 630. This optimization 630 may take the form of known and state-of-the-art algorithms using the new data provided by an MDTSDB system 330 or may consist of entirely new algorithms as they are devised by those working in the field.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit ("ASIC"), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 7:
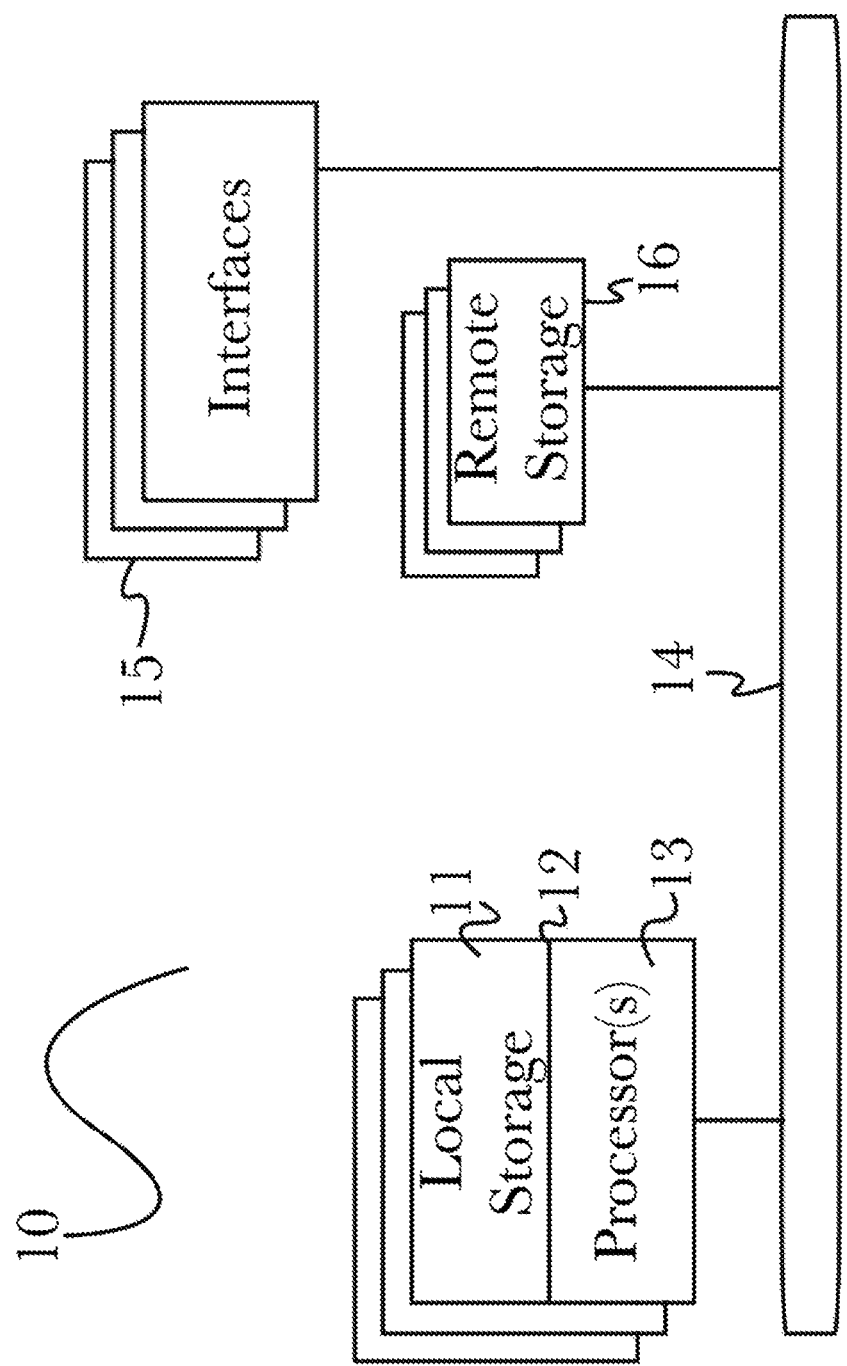
FIG. 7 is a block diagram illustrating an exemplary hardware architecture of a computing device.

Referring now to FIG. 7, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one embodiment, a computing device 10 may be configured or designed to function as a server system utilizing CPU 12, local memory 11 and/or remote memory 16, and interface(s) 15. In at least one embodiment, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a specific embodiment, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAP-DRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 7 illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one embodiment, a single processor 13 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 8:
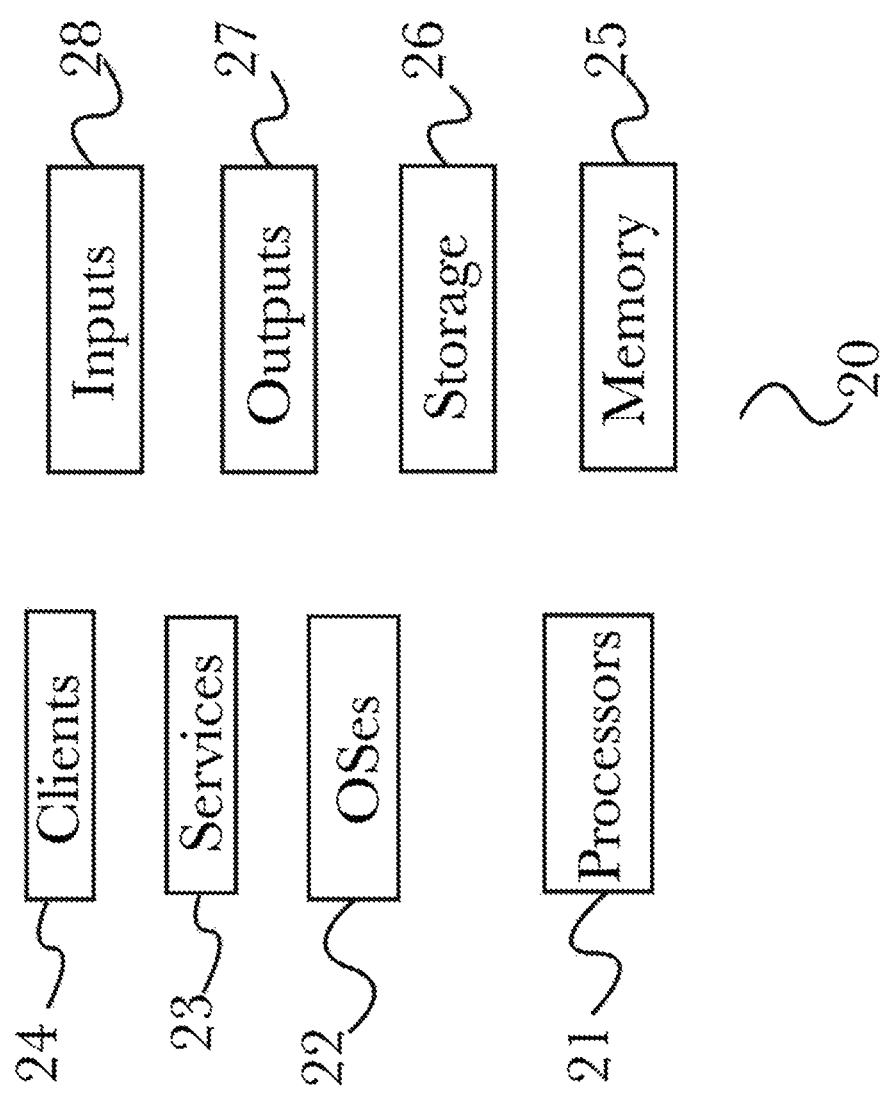
FIG. 8 is a block diagram illustrating an exemplary logical architecture for a client device.

In some embodiments, systems according to the present invention may be implemented on a standalone computing system. Referring now to FIG. 8, there is shown a block diagram depicting a typical exemplary architecture of one or more embodiments or components thereof on a standalone computing system. Computing device 20 includes processors 21 that may run software that carry out one or more functions or applications of embodiments of the invention, such as for example a client application 24. Processors 21 may carry out computing instructions under control of an operating system 22 such as, for example, a version of MICROSOFT WINDOWS™ operating system, APPLE OSX™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 7). Examples of storage devices 26 include flash memory, magnetic hard drive, CD-ROM, and/or the like.

Figure 9:
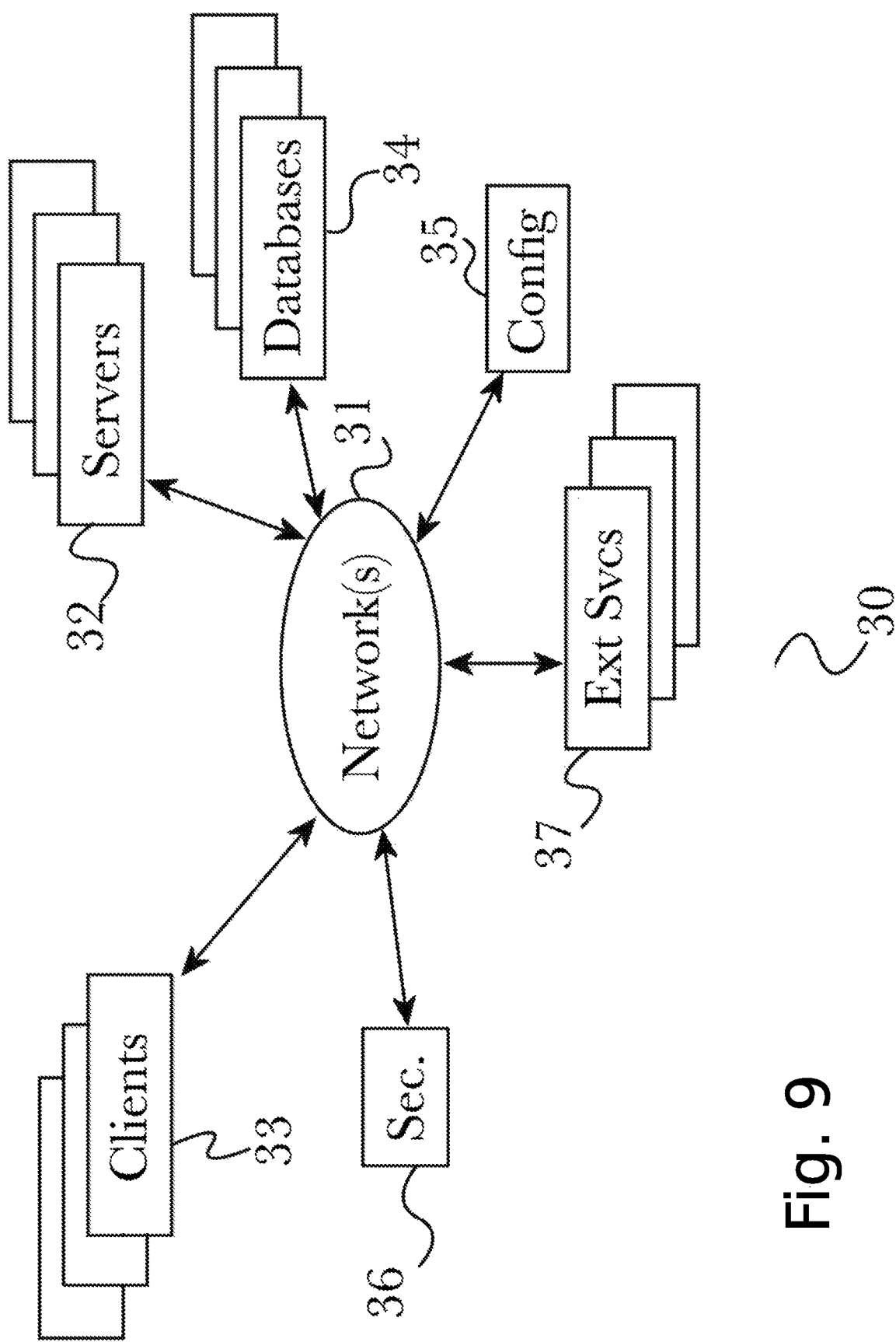
FIG. 9 is a block diagram showing an exemplary architectural arrangement of clients, servers, and external services.

In some embodiments, systems of the present invention may be implemented on a distributed computing network, such as one having any number of clients and/or servers. Referring now to FIG. 9, there is shown a block diagram depicting an exemplary architecture 30 for implementing at least a portion of a system according to an embodiment of the invention on a distributed computing network. According to the embodiment, any number of clients 33 may be provided. Each client 33 may run software for implementing client-side portions of the present invention; clients may comprise a system 20 such as that illustrated in FIG. 8. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the invention does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in an embodiment where client applications 24 are implemented on a smartphone or other electronic device, client applications 24 may obtain information stored in a server system 32 in the cloud or on an external service 37 deployed on one or more of a particular enterprise's or user's premises.

In some embodiments of the invention, clients 33 or servers 32 (or both) may make use of one or more specialized services or appliances that may be deployed locally or remotely across one or more networks 31. For example, one or more databases 34 may be used or referred to by one or more embodiments of the invention. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most embodiments of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 36 or configuration system 35 or approach is specifically required by the description of any specific embodiment.

Figure 10:
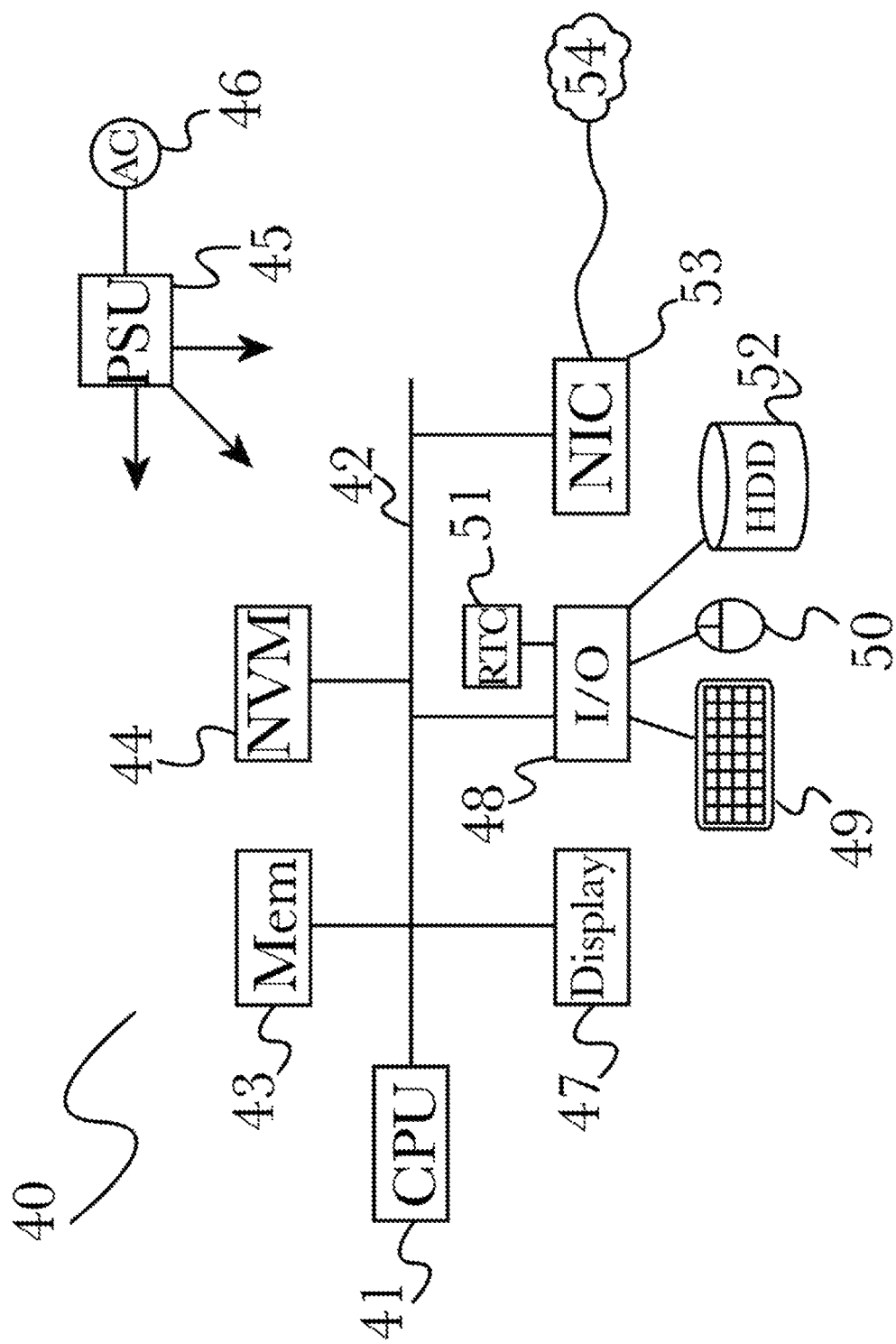
FIG. 10 is another block diagram illustrating an exemplary hardware architecture of a computing device.

FIG. 10 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of the present invention may be distributed among any number of client and/or server components. For example, various software modules may be implemented for performing various functions in connection with the present invention, and such modules may be variously implemented to run on server and/or client components.

The skilled person will be aware of a range of possible modifications of the various embodiments described above. Accordingly, the present invention is defined by the claims and their equivalents.

What is claimed is:

1. A system for optimization and load balancing for computer clusters, comprising:
   a computing device comprising a memory, a processor, and a non-volatile data storage device;
   a distributed computational graph module comprising a first plurality of programming instructions stored in the memory and operating on the processor, wherein the first plurality of programming instructions, when operating on the processor, causes the computing device to:
   receive a distributed computational graph defining a data processing workflow wherein:
      the vertices of the distributed computational graph represent data transformation stages and the edges of the distributed computational graph represent messaging between the data transformation stages; and
      the data processing workflow comprises one or more data pipelines for analysis of load balancing of a plurality of devices, each data pipeline comprising a series of nodes and edges of the directed computational graph;
   maintain a plurality of connections with each of the plurality of devices over a network, wherein each connection provides the ability to send data to, and receive data from, the respective device over the network;
   analyze a dataset using the data pipeline as requested by a load forecasting application to produce a load balancing result;
   a multidimensional time-series database module comprising a second plurality of programming instructions stored in the memory and operating on the processor, wherein the second plurality of programming instructions, when operating on the processor, causes the computing device to:
   record received data from the plurality of devices according to a user configuration, wherein the recording occurs continuously over time and wherein the recorded data comprises both the received data from each of the plurality of devices and a time stamp describing when the data was originally received from each device;
   provide response data comprising portions of the recorded data as requested by the load forecasting application; and
   the load forecasting application comprising a third plurality of programming instructions stored in the memory and operating on the processor, wherein the third plurality of programming instructions, when operating on the processor, causes the computing device to:
   query the multidimensional time-series database for portions of the recorded data for one or more of the plurality of devices;
   utilize the response data received from the multidimensional time-series database to produce a load simulation, wherein the load simulation comprises a the distributed computational graph;
   provide the distributed computational graph to the directed computational graph module for execution;
   receive the load balancing result from the directed computational graph; and
   create a redistribution of a processing load among the plurality of devices.

2. The system of claim 1, wherein the load forecasting application queries data from a database other than the multidimensional time-series database.

3. The system of claim 1, wherein the load forecasting application operates on continuous data from a multidimensional time-series database operating on the same computing device as the load forecasting application.

4. The system of claim 1, wherein the load forecasting application operates on continuous data from a multidimensional time-series database operating on a device connected by a network.

* * * * *